(12) United States Patent
Abe

(10) Patent No.: US 6,245,588 B1
(45) Date of Patent: Jun. 12, 2001

(54) SEMICONDUCTOR LIGHT-EMITTING DEVICE AND METHOD OF MANUFACTURING THE SAME

(75) Inventor: Hiromitsu Abe, Kyoto (JP)

(73) Assignee: Rohm Co., LTD, Kyoto (JP)

(*) Notice: Subject to any disclaimer, the term of this patent is extended or adjusted under 35 U.S.C. 154(b) by 0 days.

(21) Appl. No.: 09/309,271

(22) Filed: May 11, 1999

Related U.S. Application Data

(62) Division of application No. 08/843,443, filed on Apr. 16, 1997, now abandoned.

(30) Foreign Application Priority Data

Apr. 19, 1996 (JP) .................................... 8-098025

(51) Int. Cl.[7] .................................... H01L 21/20
(52) U.S. Cl. .................. 438/22; 438/46; 438/977
(58) Field of Search .................. 438/22, 37, 46, 438/47, 483, 977; 257/94

(56) References Cited

U.S. PATENT DOCUMENTS

| | | | |
|---|---|---|---|
| 3,820,237 | 6/1974 | Effer | 257/98 |
| 3,821,775 | 6/1974 | Biard | 257/98 |
| 5,008,718 | * 4/1991 | Fletcher et al. | 257/13 |
| 5,115,286 | * 5/1992 | Camras et al. | 257/13 |
| 5,181,218 | * 1/1993 | Ishikawa et al. | 372/45 |
| 5,233,204 | 8/1993 | Fletcher | 257/97 |
| 5,235,194 | 8/1993 | Izumiya | 257/97 |
| 5,376,580 | * 12/1994 | Kish et al. | 438/22 |
| 5,432,359 | 7/1995 | Sekiwa | 257/97 |
| 5,631,475 | 5/1997 | Watabe | 257/97 |
| 5,677,922 | * 10/1997 | Hayafuji et al. | 372/49 |
| 5,739,553 | 4/1998 | Noto | 257/97 |
| 5,962,875 | * 10/1999 | Motoki et al. | 257/103 |
| 6,072,196 | * 6/2000 | Sato | 257/87 |
| 6,100,544 | * 8/2000 | Lin et al. | 257/34 |
| 6,107,647 | * 8/2000 | Matsumoto et al. | 257/94 |

FOREIGN PATENT DOCUMENTS

| | | | |
|---|---|---|---|
| 02229152 | * | 8/1990 | (JP) . |
| 08078725 | * | 3/1996 | (JP) . |

OTHER PUBLICATIONS

Ko et al "A New Structure of 780 High powe laser diode with non–absorbing mirrors". Applied Physics A, Material Science of Processing, 68, 467–470 (1999).*

* cited by examiner

*Primary Examiner*—Savitri Mulpuri
(74) *Attorney, Agent, or Firm*—Arent, Fox, Kintner, Plotkin, Kahn PLLC

(57) ABSTRACT

A semiconductor light-emitting device includes a substrate formed of an AlGaAs-base semiconductor material. A light-emitting layer forming portion of an AlGaInP-base compound semiconductor material is formed on the substrate so as to provide a light emitting layer. On the surface of the light-emitting layer forming portion, an window layer of an AlGaAs-base semiconductor material is provided. An upper electrode is formed on the upper-side layer in electrical connection therewith, while a lower electrode formed on the substrate in electrical connection therewith. The light-emitting layer forming portion is of an overlaid structure formed by a clad layer formed in a first conductivity type on the substrate. An active layer is formed on the clad layer to have a composition with a lower band gap energy than that of the clad layer. A clad layer is formed in a second conductivity type on the active layer to have the same composition as the first-conductivity clad layer. The light emitted by the light-emitting layer forming portion and traveling toward the substrate is absorbed less by the substrate, which is rather reflected for outer radiation on the light radiation side. As a result, the efficiency of light radiation is improved to offer a semiconductor light-emitting device with higher brightness.

4 Claims, 3 Drawing Sheets

SEMICONDUCTOR LIGHT-EMITTING DEVICE AND METHOD OF MANUFACTURING THE SAME

This application is a divisional application of prior application Ser. No. 08/843,443 filed Apr. 16, 1997, now abandoned.

FIELD OF THE INVENTION

This invention relates to a semiconductor device which has a light-emitting layer formed of an AlGaInP-base semiconductor material for emitting green to red portions of visible light. More specifically, this invention is concerned with a semiconductor light-emitting device which is improved in light-emitting efficiency so as to be utilized for a light source, requiring brightness of light, such as for outdoor displays, tail lamps or indicators for automobiles, besides applications for optical transmission or optical information processing.

BACKGROUND OF THE INVENTION

There is illustrated in FIG. 7 a structure of a light-emitting device formed of a conventional AlGaInP-base semiconductor material. That is, as shown in the figure, an n-type GaAs substrate 11 has thereon a light-emitting layer forming portion 19. The light-emitting layer forming portion 19 comprises an n-type lower clad layer 12 formed of an n-type AlGaInP-base semiconductor material on the substrate 11, an active layer 13 formed of a non-doped AlGaInP-base semiconductor material on the lower clad layer 12, and an upper clad layer 14 formed of a p-type AlGaInP-base semiconductor material on the active layer 13. Furthermore, a window layer 15 is formed on the surface of the light-emitting layer forming portion 19. These layers are sequentially formed on the substrate 11 by epitaxial growth. An upper electrode 17 is formed of gold or aluminum through a GaAs contact layer 16, while a lower electrode 18 is formed also gold or aluminum on a back surface of the substrate 11.

The light-emitting device of this kind is of a double hetero structure, in which the mixed crystal ratio for the light-emitting layer forming portion 19, i.e., the clad layers 12, 14 and the active layer 13, is determined so as to confine carriers within the active layer 13 sandwiched between the both clad layers 12, 14 for enhancing efficiency of emission of light. Since the light-emitting device of this type is adapted to radiate light through a top-surface side, the upper electrode 17 is provided in such a minimal size for supplying electric current that the light is less obstructed or absorbed by the upper electrode.

However, in the conventional light-emitting device formed of the AlGaInP-base semiconductor material as above, the light created by the light-emitting layer forming portion 19 having the active layer 13 sandwiched by the clad layers 12, 14 travels, besides upwards, sideways and downward of the chip to be radiated outward. However, the semiconductor substrate 11 of GaAs is of not transparent for the light thus emitted so that the light traveling toward the semiconductor substrate is absorbed by the substrate. To this end, the light radiation available is limited only to the portion of the light emitted upward, without being obstructed by the upper electrode 17, from the light-emitting layer forming portion 19. Therefore, there is a problem that the efficiency of light radiation is low, and accordingly the brightness of light is also low.

On the other hand, there can be thought of using the material such as an AlGaAs-base material which is epitaxially grown over a light-emitting layer forming portion 19 for a substrate 11. The AlGaAs-base material has a composition with a mixture crystal ratio of Al greater than 0.7 so that the longer wavelength portion of visible light than that of yellow light is less absorbed by the material. However, the AlGaAs-base material is liable to oxidize so that it is practically impossible to grow an AlGaInP-base material on the AlGaAs-base material.

SUMMARY OF THE INVENTION

It is therefore a primary object of the present invention to solve the abovestated problem and provide a semiconductor light-emitting device wherein there occurs less absorption of the light emitted toward the back surface of the substrate, thereby enhancing the efficiency of light radiation.

It is another object of the present invention to provide a method of manufacturing semiconductor light-emitting device wherein the light emitted to travel toward the substrate is utilized for light radiation.

In accordance with the present invention, there is provided a semiconductor light-emitting device comprising: a substrate formed of an AlGaAs-base semiconductor material; a light-emitting layer forming portion formed of an AlGaInP-base compound semiconductor material overlying the substrate so as to provide a light-emitting layer, the light-emitting layer forming portion having an upper-side layer; an upper electrode formed on the upper-side layer in electrical connection therewith; and a lower electrode formed on the substrate in electrical connection therewith.

Here, the AlGaInP-base material refers to a material that is expressed by a chemical formula for example of $(Al_xGa_{1-x})_{0.51}In_{0.49}P$, where the value x is variable between 0 and 1. Also, the AlGaAs-base material refers to a material that is expressed by a chemical formula of $Al_yGa_{1-y}As$, where the value y is variable between 0.5 and 0.8.

Preferably, a window layer is provided on the upper-side layer, the window layer being formed of an AlGaAs-base compound semiconductor material to a layer thickness of greater than 30 (m. With such structure, electric currents passing through the semiconductor chip are spread almost close to side faces of the chip, widening the light radiation area.

More preferably, the lower electrode is provided on part of a back surface of the substrate. With such structure, if a highly-reflective die-pad on which the light-emitting chip is to be mounted is employed, the light reflected by the die-pad is utilized for radiation with higher efficiency.

Further preferably, the light-emitting layer forming portion is of an overlaid structure formed by a clad layer formed in a first conductivity type on the substrate, an active layer formed on the clad layer to have a composition with a lower band gap energy than that of the clad layer, and a clad layer formed in a second conductivity type on the active layer to have the same composition as the first-conductivity clad layer. With such structure, the efficiency of emission of light is further enhanced.

In accordance with the present invention, there is also provided a method of manufacturing a semiconductor light-emitting device comprising the steps of: (a) forming by overlaying on a GaAs substrate, in order, a first window layer of an AlGaAs-base compound semiconductor material, a light-emitting layer forming portion of an AlGaInP-base compound semiconductor material, and a second window layer of an AlGaAs-base compound semiconductor material; (b) forming an AlGaAs-base compound semiconductor layer on the second window layer by a liquid-phase epitaxial growth method; (c) removing away the GaAs substrate to render the epitaxially grown AlGaAs-base semiconductor layer to be a new substrate, providing a semiconductor overlaying structure; and (d) forming electrodes on opposite surfaces of the semiconductor overlaying structure.

Preferably, the liquid-phase epitaxial growth of a third window layer of AlGaAs-base material is made on the surface of the first window layer exposed by removing the GaAs substrate, which makes possible formation of a thick window layer in a brief time period. By doing so, the resulting light-emitting device has electric currents passing therethrough spread almost the entire of the semiconductor chip.

The abovestated object, other objects, features and advantages of this invention will be more apparent from the following description on examples with reference to the accompanying drawings.

DETAILED DESCRIPTION OF THE INVENTION

The semiconductor light-emitting element and the method of manufacturing the same will now be explained with reference to the drawings.

Figure 1:
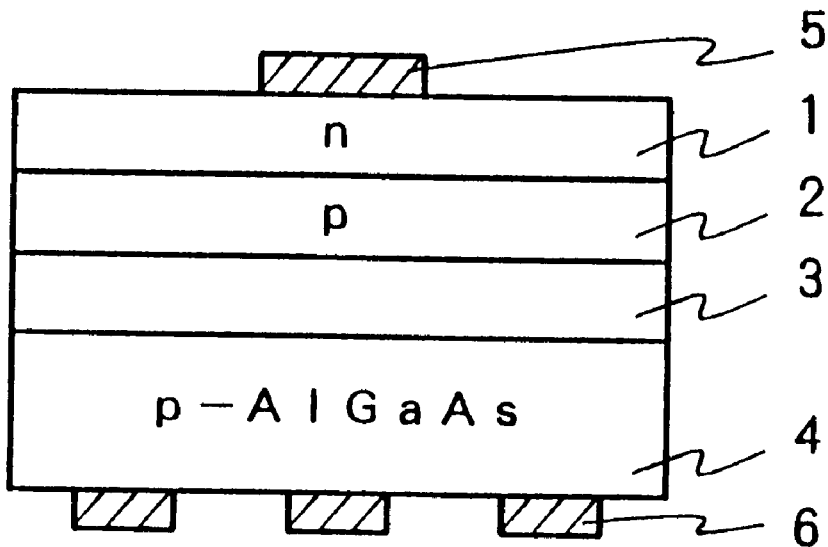
FIG. 1 is a sectional explanatory view of one embodiment of a semiconductor light-emitting device according to the present invention.

Referring first to FIG. 1, there is illustrated an explanatory sectional view of a compound-semiconductor light emitting device of the present invention, which comprises a substrate 4 of AlGaAs-base semiconductor, a second window layer 3 formed on the substrate 4, a light-emitting layer forming portion 2 formed of an AlGaInP-base semiconductor on the second window layer 3, and a first window layer 1 formed of an AlGaAs-base semiconductor. For providing electrical connection, an n-side (upper) electrode 5 is formed on a surface of the first window layer 1 through which light is radiated outward, while a p-side (lower) electrode 6 is formed on a back surface of the substrate 4. In the light-emitting device of the present invention, the substrate 4 is formed by an AlGaAs-base compound semiconductor material that is less absorptive of light emitted by the light-emitting layer forming portion 2.

With such arrangement, part of the light emitted by the light-emitting layer forming portion 2 is directly radiated outward through the first window layer 1, while the other part of the light traveling toward the substrate 4 is reflected by the back surface thereof.

The light-emitting layer forming portion 2 is formed by an AlGaInP semiconductor to have a lower clad layer of a first or p conductivity type, an active layer as a light-emitting layer overlying the lower clad layer, and an upper clad layer formed of a second or n conductivity type overlying the active layer. That is, the lower clad layer and the upper clad layer are of the same composition but opposite in conductivity type. The active layer is in a composition having a band-gap energy smaller than that of the upper and lower clad layers. To provide a small bad-gap energy to an active layer, the ratio of Al in the AlGaInP mixed crystal is reduced relative to that of the lower and upper clad layers. Incidentally, although this example is based on so-called a doublehetero structure, the formation of such a mixed crystal is available with a usual pn structure.

Figure 7:
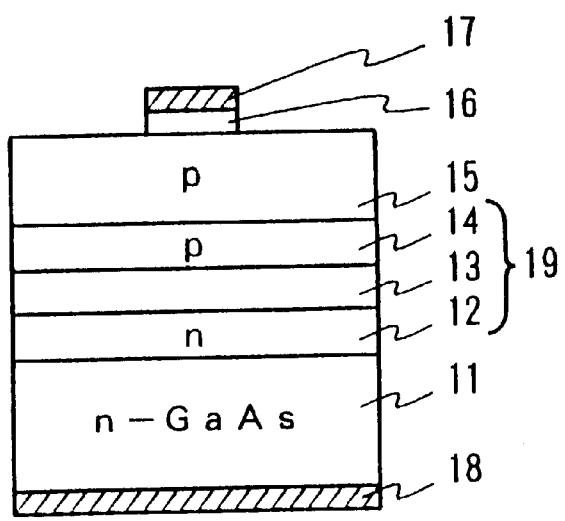
FIG. 7 is a sectional explanatory view of a conventional semiconductor light-emitting device.

The electrodes 5, 6 are formed of gold or aluminum. The n-side electrode 5, which is located on a side of light radiation, is formed to such a pattern that is sufficient for supplying electric current but less obstructive to radiation of light. Meanwhile, in the example of FIG. 1, the p-side electrodes 6 is also not over the entire back surface of the substrate 4 but partially patterned into a polka-dot form or a rectangular matrix form, because of reduction of light absorption as hereinafter explained. Incidentally, although in FIG. 1 the n-side electrode 5 is directly provided on the second window layer 1, it is preferred that a GaAs contact layer is provided between the electrode 5 and the window layer 1 to reduce the contact resistance in a manner similar to the conventional structure of FIG. 7.

Figure 2:
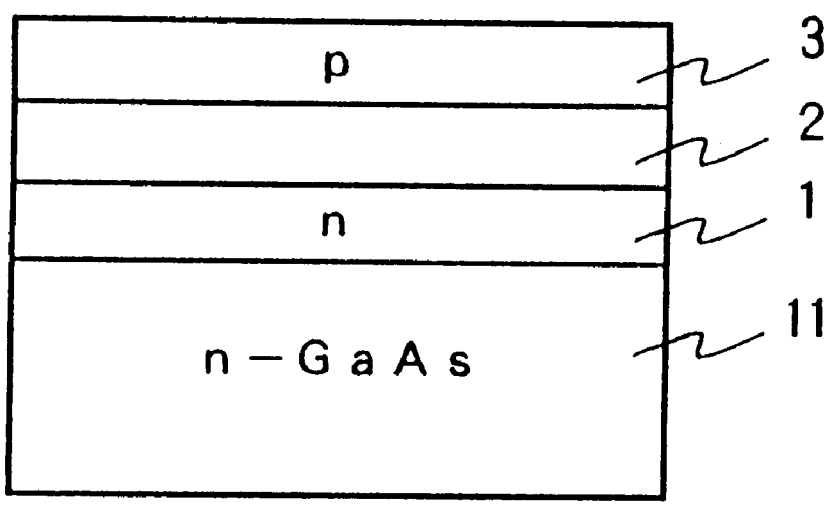
FIG. 2 to FIG. 4 are views showing a manufacturing process of the semiconductor light-emitting device of the present invention.
Figure 3:
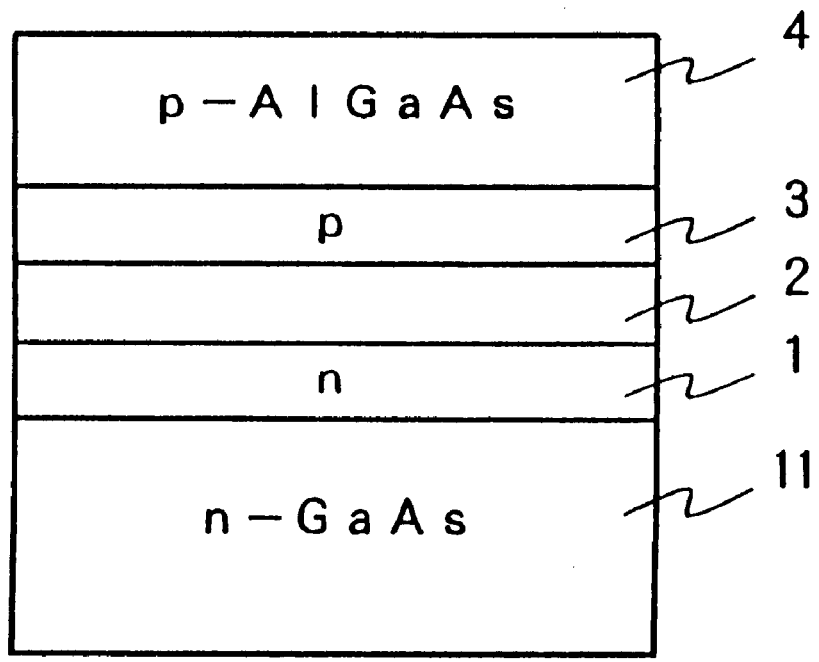
Figure 4:
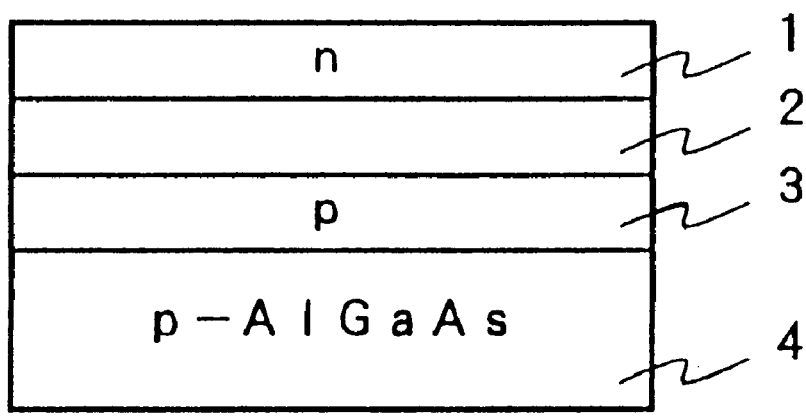

The method of manufacturing a semiconductor light-emitting device will then be explained by referring to FIG. 2 to FIG. 4. Referring to FIG. 2, first an n-GaAs substrate 1 on which a first window layer 1 of an AlGaAs-base material is formed. On the first window layer 1, a light-emitting layer forming portion 2 of an AlGaInP-base material is formed. The light-emitting layer forming portion 2 has an active layer, not shown, sandwiched between upper and lower clad layers, not shown. Subsequently, a second window layer 3 is formed of an AlGaAs-base material on the light-emitting layer forming portion 2. The first window layer 1, the light-emitting layer forming portion 2, and the second window layer are sequentially epitaxially grown on the n-GaAs substrate 11 for example by an MOCVD (metal-organic chemical vapor deposition) technique.

More specifically, the first window layer of n-$Al_{0.7}Ga_{0.3}As$ having a dopant concentration of selenium Se) of $1\times10^{18}$ cm$^{-3}$ is epitaxially grown to a layer thickness of approximately 5 μm on the n-GaAs substrate 11. Then, a first clad layer of n-$(Al_{0.7}Ga_{0.3})_{0.51}In_{0.49}P$ having an Se dopant concentration of $1\times10^{17}$ cm$^{-3}$ is epitaxially grown to a layer thickness of approximately 0.5 μm, an active layer of non-doped $(Al_{0.25}Ga_{0.75})_{0.51}In_{0.49}P$ is epitaxially grown to a layer thickness of approximately 0.5 μm, and a second clad layer of p-$(Al_{0.7}Ga_{0.3})_{0.51}In_{0.49}P$ having an zinc (Zn) dopant concentration of $1\times10^{17}$ cm$^{-3}$ is epitaxially grown to a layer thickness of approximately 0.5 μm. Thereafter, the second window layer of p-$Al_{0.7}Ga_{0.3}As$ having a Zn concentration of $1\times10^{18}$ cm$^{-3}$ is epitaxially grown to a layer thickness of approximately 5 μm. The light-emitting layer forming portion 2 comprises the active region and the n-type and p-type clad layers sandwiching the active region, wherein the Al ratio of the mixed crystal is varied between the active layer and the clad layers so that, in the doublehetero structure, the light created is confined within the active layer.

Then an AlGaAs-base compound semiconductor layer 4 is epitaxially grown over the p-type clad layer, as shown in FIG. 3, to a layer thickness of 50 μm or greater. Specifically, An $Al_yGa_{1-y}As$ ($0.5 \leq y \leq 0.7$) doped with a Zn impurity concentration of $5\times10^{17}$ to $5\times10^{18}$ cm$^{-3}$ is overlaid by a liquid-phase epitaxial growth (LPE) technique to a layer thickness of approximately 100 μm. Although with an MOCVD technique it takes long time for growing a semiconductor layer to a thick layer thickness, it is possible to grow a thick semiconductor layer by a liquid-phase growing method in a brief time. In the present case, when the growth is changed over from the MOCVD method to the LPE method, the surface of the semiconductor layer thus overlaid is exposed to air to have an oxide film thereon. However, it is possible to melt-back the surface to dissolve part of the surface prior to the liquid-phase growth. Consequently, the epitaxial growth is possible over a cleaned semiconductor surface.

Thereafter, the GaAs substrate 11 is removed and the substrate having grown semiconductor layers are placed upside down as shown in FIG. 4, so that the AlGaAs-base semiconductor layer 4 is placed as a semiconductor substrate. As a result, the first window layer 1 is positioned to a top side, and the respective semiconductor layers comprised of the window layer 1, the underlying light-emitting layer forming portion 2, etc. are held on the AlGaAs-base semiconductor layer 4. The removal of the GaAs substrate 11 can be carried out by mechanical grinding or chemical etching.

Then electrodes 5, 6 are respectively formed on the top and bottom surfaces in a manner similar to the conventional, and thereafter the wafer thus formed is divided by dicing into individual chips, providing chips of light-emitting devices as shown in FIG. 1. In the formation of the electrode, the lower electrode or the p-side electrode 6 is partly formed by selective etching instead of providing on the entire surface of the substrate. The lower electrode 6 is preferably provided at different on-surface locations from that of the upper electrode or the n-side electrode 5 so that electric current flows therebetween in a manner spreading sideways in the device chip for enhancing light-emitting efficiency. As stated before, part of the light emitted by the light-emitting layer forming portion 2 is directly radiated outward through the first window layer 1, while the other part of the light travels toward the substrate 4 to be reflected by the back surface thereof. However, the lower electrode 6 of gold or aluminum acts to absorb light upon reflection. The light traveling toward the backside of the substrate is reflected with greater efficiency by reducing the area of the lower electrode 6. It is therefore preferred that the area of the lower electrode 6 is reduced smaller but the electric current supplied through the chip is spread as broad as possible.

Figure 6:
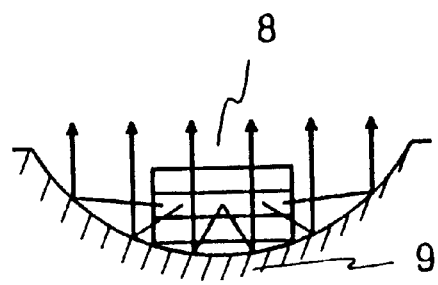
FIG. 6 is a view for explaining radiation of light by a chip of the semiconductor light-emitting device of the present invention in a state of being mounted on a leadframe.

The light-emitting chip thus fabricated was examined as to brightness of light. As shown in FIG. 6, the chip was bonded onto a leadframe at a concave recess 9 ordinarily formed and wire-bonded to the lead. The chip was then encapsulated by a transparent resin in a lens shape, being formed into a lamp. It was found that the lamp thus obtained has brightness, on the lamp axis, three times that of the conventional lamp. This is because the light traveling toward the backside of the chip is reflected upward with less absorption. Furthermore, the light obstructed by the upper electrode also seems to be reflected by the lower side, being effectively utilized.

According to the present invention, the substrate 4 is formed of AlGaAs-base semiconductor so that it is almost transparent for the visible portion of light with a wavelength of 590 nm or greater. The light emitted from the light-emitting layer is allowed to pass through the substrate without being absorbed. Accordingly, the light emitted toward the backside is reflected by the backside surface of the chip or the concave surface of the leadframe, enhancing light radiation efficiency. In this manner, the semiconductor light-emitting device of the present invention is excellent in brightness of light on the axis thereof, as compared with the conventional device.

Figure 5:
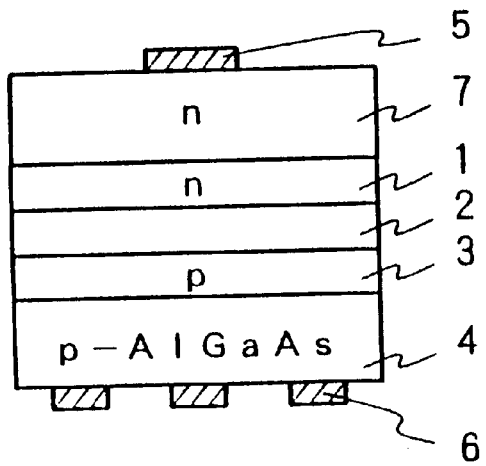
FIG. 5 is a view showing a structure of another embodiment of the semiconductor light-emitting device of the present invention.

Referring to FIG. 5, there is illustrated an improved structure of the inventive semiconductor light-emitting device, wherein a window layer 7 is provided overlying the first window layer 1. That is, the first window layer 1 is exposed at a top surface by the removal of the GaAs substrate as stated before, and thereafter the window layer 7 is formed of an AlGaAs-base semiconductor to a layer thickness of approximately 30 $\mu$m or greater by a liquid-phase epitaxial growth technique. More specifically, $Al_yGa_{1-y}As$ ($0.6 \leq y \leq 0.75$) doped with tellurium (Te) to a dopant concentration of $5 \times 10^{17}$ to $5 \times 10^{18}$ cm$^{-3}$ is grown by the liquid-phase epitaxial technique to a thickness of approximately 50 $\mu$m. In other words, the window layer 7 based on the same composition as the window layer 1 is provided thick, e.g., 50 $\mu$m. With such structure, the semiconductor light-emitting device is enhanced in window effect by which electric currents are spread entirely within the chip, thereby enhancing light radiation efficiency. The utilization of the liquid-phase growth of the window layer 7 is due to the ground that the MOCVD method is difficult to form a semiconductor layer with a thickness in excess for example of 10 $\mu$m with preferred quality. With liquid-phase epitaxy, it is possible to clean the top surface of the first window layer 1 by melting back the GaAs substrate, in order to grow thereon a window layer 7 at a high growing rate with proper crystal structure. It was found that, where a light-emitting chip having a structure as shown in FIG. 5 is assembled into a lamp by die-bonding onto a concave recess of a leadframe in a manner similar to the above, it has an axial brightness 5 times higher than that of the conventional structure.

In the abovestated examples, the semiconductor light-emitting device was of an n-side-up structure wherein an n-type GaAs substrate is employed to form thereon a plurality of semiconductor layers. It is needless to say that a p-type GaAs substrate may alternatively be used as a starting substrate to form a p-side-up structure.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor light-emitting device comprising the steps of:
    (a) forming by overlaying on a GaAs substrate, in order, a first window layer of an AlGaAs-base compound semiconductor material, a light-emitting layer forming portion of an AlGaInP-base compound semiconductor material, and a second window layer of an AlGaAs-base compound semiconductor material by vapor phase epitaxial growth method, respectively;
    (b) melting back a surface of said second window layer, and forming an AlGaAs-base compound semiconductor layer on said second window layer by a liquid-phase epitaxial growth method;
    (c) removing said GaAs substrate to make said epitaxially grown AlGaAs-base semiconductor layer as a new substrate, providing a semiconductor overlaying structure; and
    (d) forming electrodes on opposite surfaces of said semiconductor overlaying structure,
    wherein a third window layer made of AlGaAs-based semiconductor is further epitaxially grown by a liquid-phase growing method on a surface of said first window layer exposed by the removal of said GaAs substrate.

2. The method of claim 1, wherein each of said electrodes is provided on part of a surface of said semiconductor overlaying structure.

3. The method of claim 1, wherein said light-emitting layer forming portion is of an overlaid structure formed by a clad layer formed in a first conductivity type on said first window layer, an active layer formed on said clad layer to have a composition with a lower band gap energy than that of said clad layer, and a clad layer formed in a second conductivity type of said active layer to have the same composition as the first conductivity clad layer.

4. The method of claim 1, wherein said third window layer has a layer thickness of greather than 30 $\mu$m.

* * * * *